(12) United States Patent
Ueda

(10) Patent No.: US 7,772,660 B2
(45) Date of Patent: Aug. 10, 2010

(54) MAGNETORESISTIVE RANDOM ACCESS MEMORY AND METHOD OF MANUFACTURING THE SAME

(75) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 224 days.

(21) Appl. No.: 12/119,720

(22) Filed: May 13, 2008

(65) Prior Publication Data

US 2008/0283946 A1 Nov. 20, 2008

(30) Foreign Application Priority Data

May 14, 2007 (JP) ............................... 2007-128499

(51) Int. Cl.
*H01L 29/82* (2006.01)
*H01L 43/00* (2006.01)
(52) U.S. Cl. ..................... 257/421; 257/295; 257/422; 257/E29.323
(58) Field of Classification Search .................. 257/295, 257/421, 422, E29.323
See application file for complete search history.

(56) References Cited

U.S. PATENT DOCUMENTS

| 5,695,864 | A |  | 12/1997 | Slonczewski |
|---|---|---|---|---|
| 6,097,625 | A |  | 8/2000 | Scheuerlein |
| 7,262,449 | B2 | * | 8/2007 | Kajiyama ................... 257/295 |

* cited by examiner

*Primary Examiner*—Thien F Tran
(74) *Attorney, Agent, or Firm*—Oblon, Spivak, McClelland, Maier & Neustadt, L.L.P.

(57) ABSTRACT

A magnetic random access memory includes a transistor having a gate electrode formed above a surface of a substrate, and first and second impurity diffusion regions which sandwich a channel region below the gate electrode, a first plug formed on the first impurity diffusion region, a recording element formed on the first plug, including a plurality of stacked layers, and configured to hold information in accordance with an internal magnetization state, a first signal line formed on the recording element, a second plug formed on the second impurity diffusion region, an electrical conductor formed on the second plug, an area of a shape of the electrical conductor, which is projected onto the surface of the substrate, being larger than that of a shape of the recording element, which is projected onto the surface of the substrate, and a second signal line formed on the electrical conductor.

12 Claims, 16 Drawing Sheets

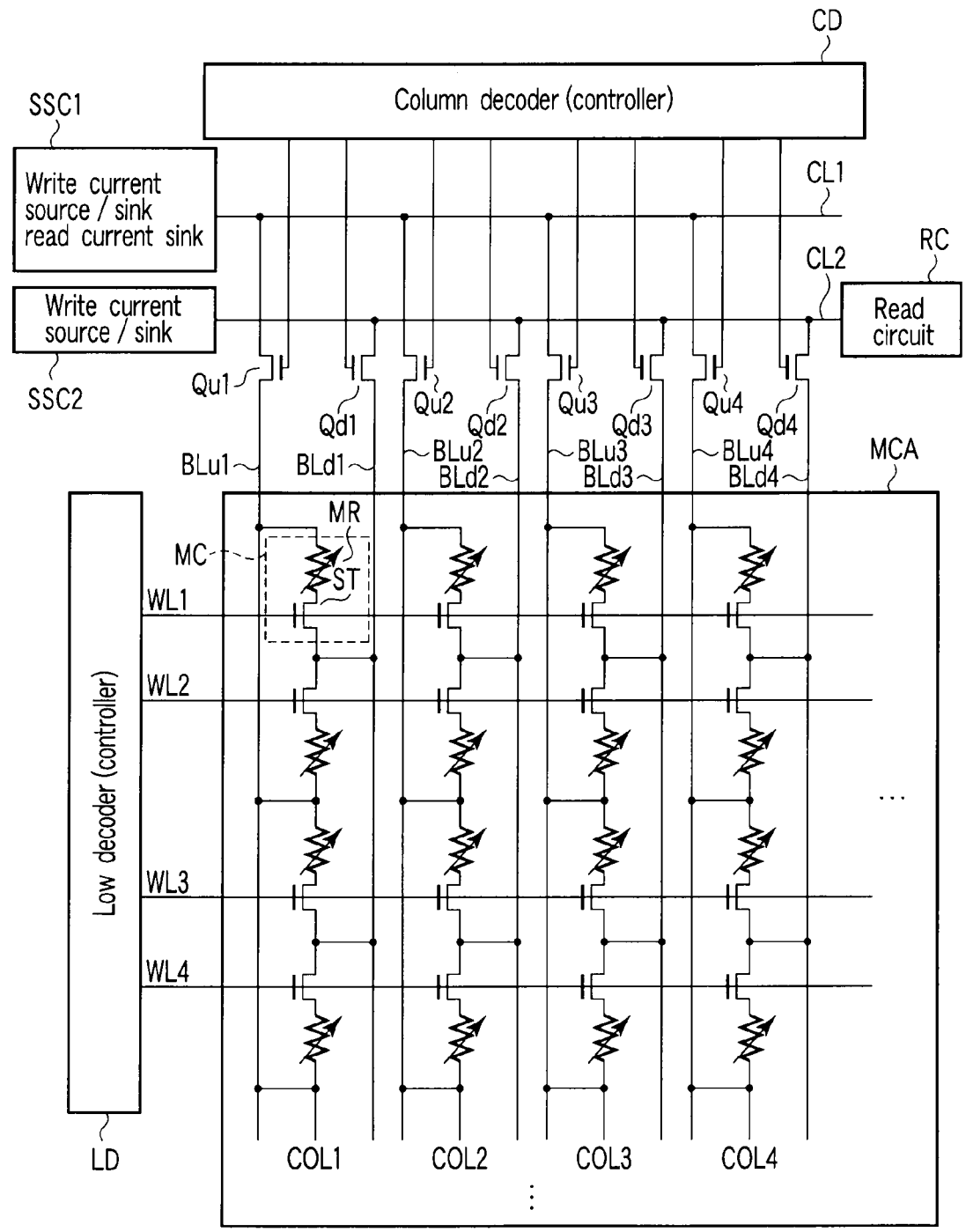
F I G. 1

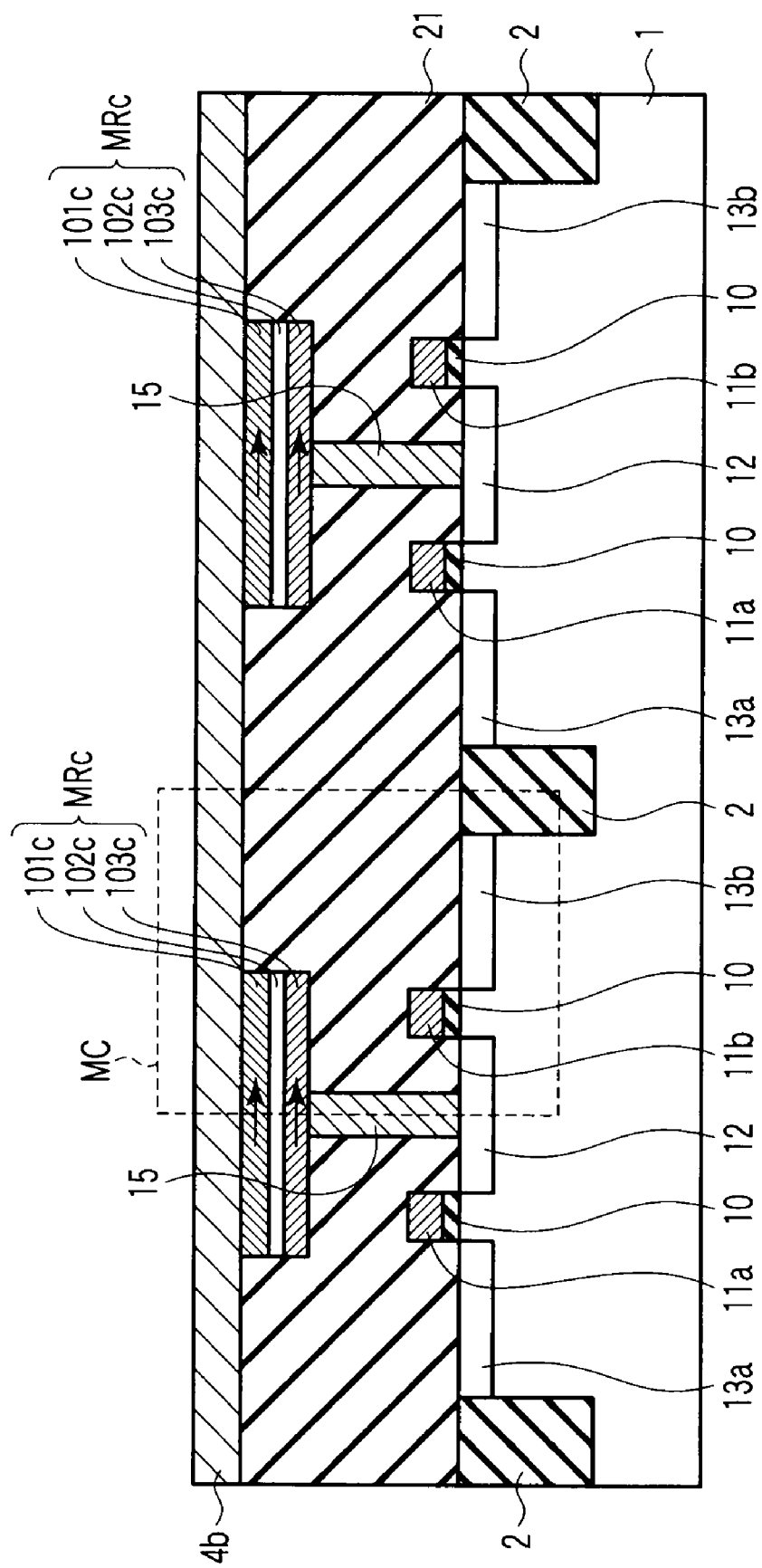
F I G. 6

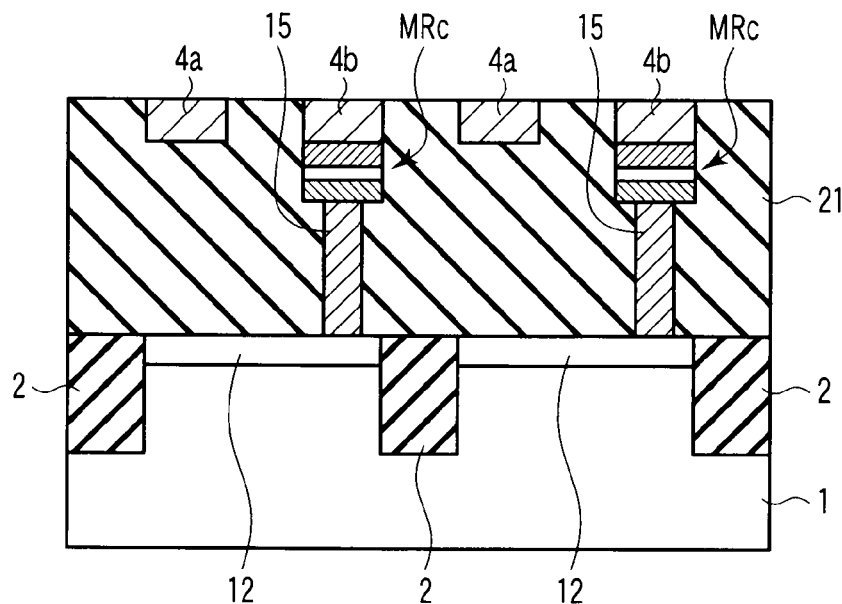
F I G. 7
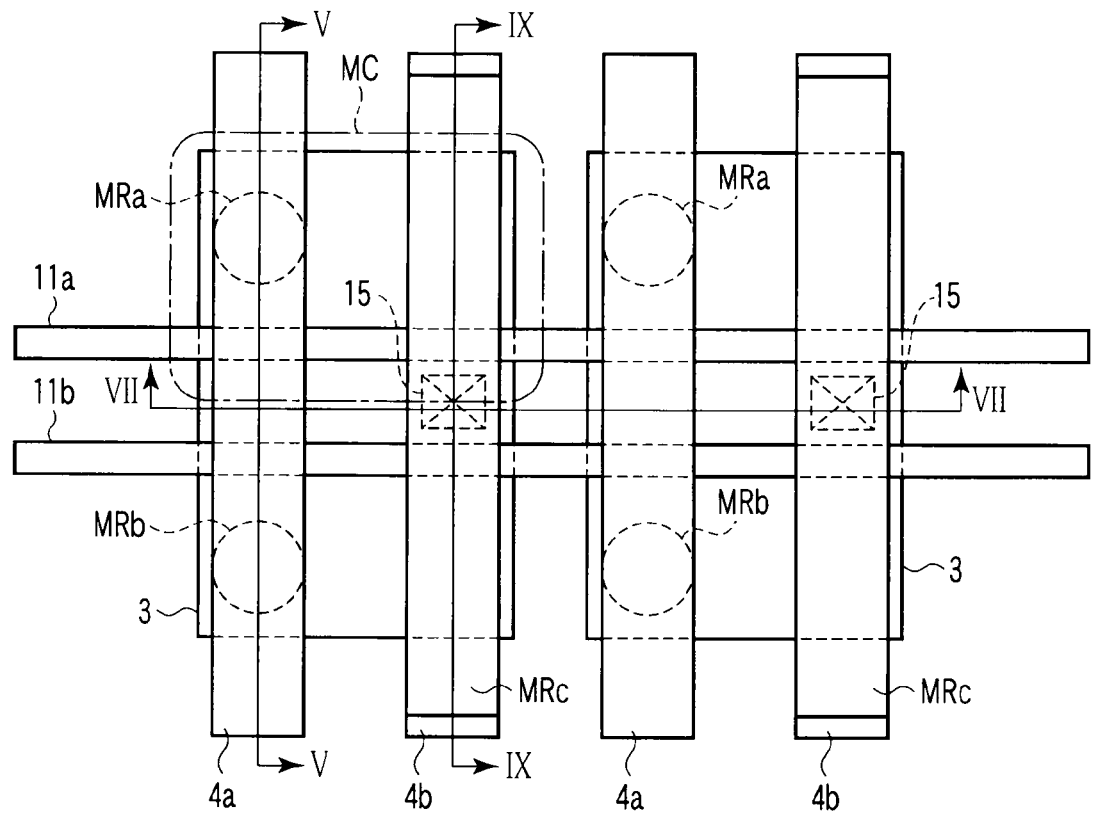
F I G. 8

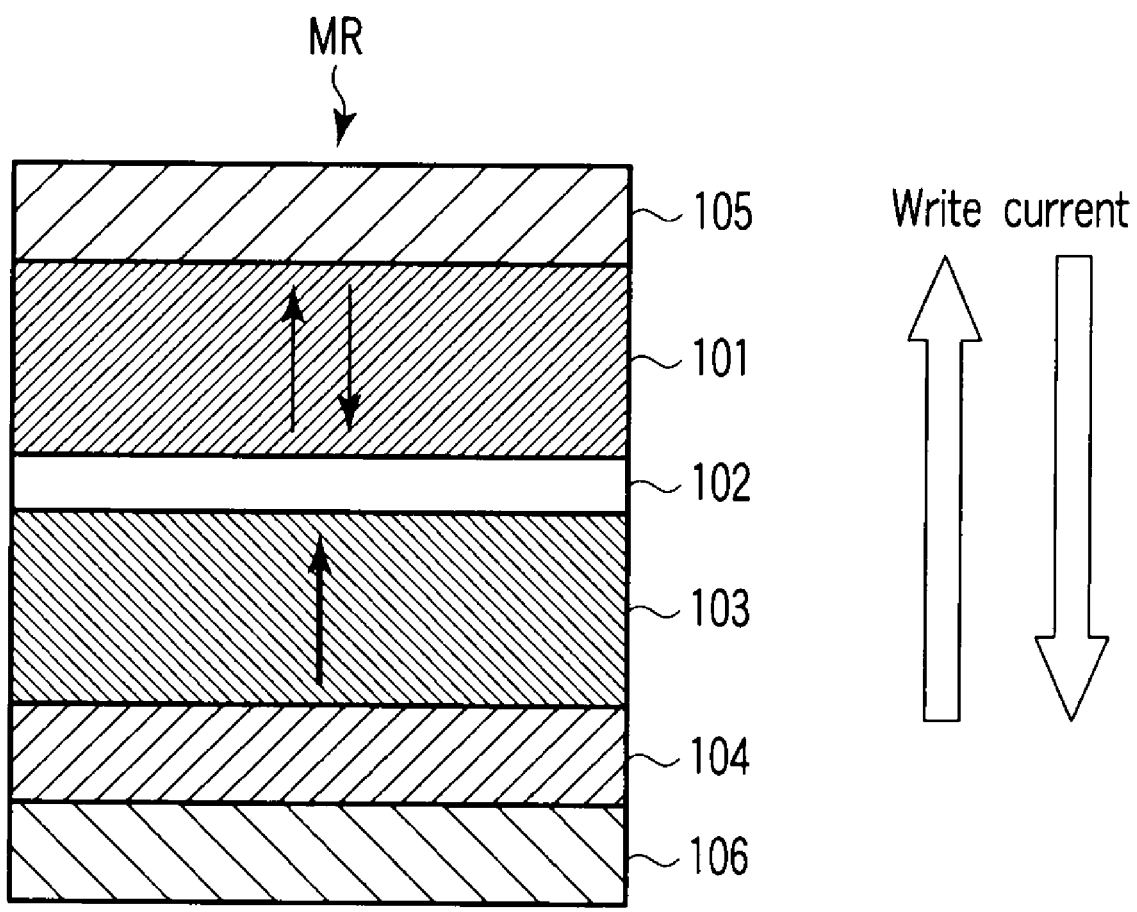
F I G. 16

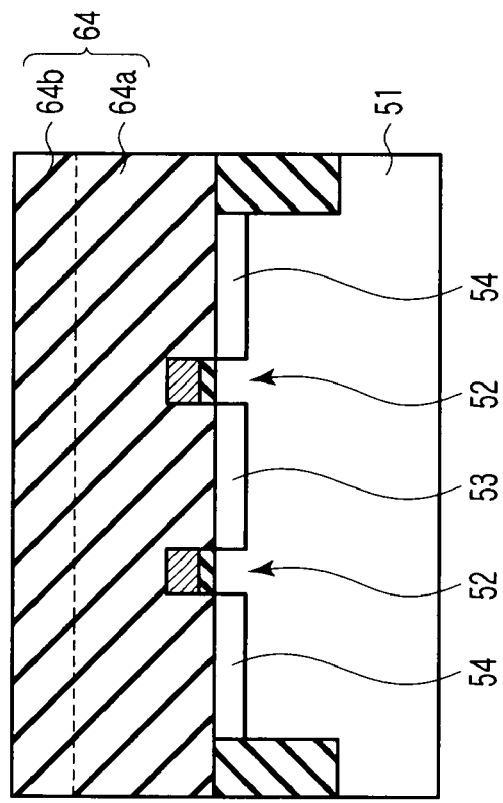
F I G. 20A
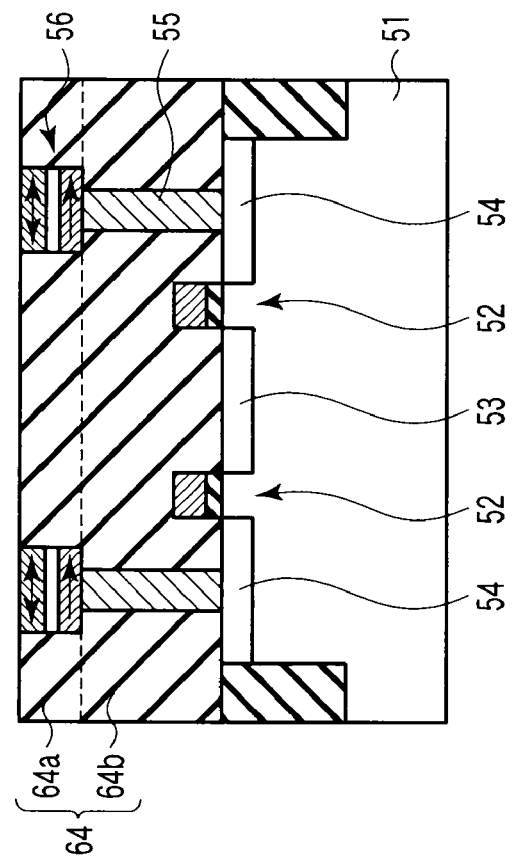
F I G. 20B

MAGNETORESISTIVE RANDOM ACCESS MEMORY AND METHOD OF MANUFACTURING THE SAME

CROSS-REFERENCE TO RELATED APPLICATIONS

This application is based upon and claims the benefit of priority from prior Japanese Patent Application No. 2007-128499, filed May 14, 2007, the entire contents of which are incorporated herein by reference.

BACKGROUND OF THE INVENTION

1. Field of the Invention

The present invention relates to a magnetoresistive random access memory, e.g., a spin transfer torque writing type magnetoresistive random access memory.

2. Description of the Related Art

A magnetoresistive random access memory (MRAM) uses a magnetoresistive effect element as a memory cell. The magnetoresistive effect element includes a free layer in which the magnetization direction is variable, a fixed layer in which the magnetization direction is fixed, and a nonmagnetic layer sandwiched between them. The resistance decreases when the magnetization direction in the free layer is parallel to that in the fixed layer, and increases when the former is antiparallel to the latter. The difference between these resistance states is used in information recording.

Information is read out by supplying a read current to the magnetoresistive effect element, and detecting the difference between the resistance states before and after the read current is supplied. Information is written by supplying, to the free layer of the magnetoresistive effect element, an electric current spin-polarized by the magnetic moment in the fixed layer, thereby changing the magnetization direction in the free layer. The direction of an electric current flowing through the magnetoresistive effect element controls the logic of data (U.S. Pat. No. 5,695,864). Compared to a write method using a magnetic field, this write method can have a direct effect on a nano-scale magnetic material. Therefore, no write error occurs in adjacent memory cells, and rapid magnetization reversal can be expected. There is also another advantage that the current amount necessary for data write reduces as the cell size decreases.

General requirements for the magnetoresistive random access memory are that the memory can be manufactured by a minimum number of manufacturing steps, the degree of integration can be increased by making each part as small as possible, and an arrangement and manufacturing method that hardly produce defects are applied in order to increase the yield.

BRIEF SUMMARY OF THE INVENTION

A magnetic random access memory according to an aspect of the present invention comprising: a semiconductor substrate; a transistor having a gate electrode formed above a surface of the substrate, and a first impurity diffusion region and second impurity diffusion region which sandwich a channel region below the gate electrode; a first conductive plug formed on the first impurity diffusion region; a recording element formed on the first plug, including a plurality of stacked layers, and configured to hold information in accordance with an internal magnetization state; a first signal line formed on the recording element; a second conductive plug formed on the second impurity diffusion region; an electrical conductor formed on the second plug and including a plurality of layers identical to the plurality of layers forming the recording element, an area of a shape of the electrical conductor, which is projected onto the surface of the substrate, being larger than that of a shape of the recording element, which is projected onto the surface of the substrate; and a second signal line formed on the electrical conductor.

A magnetic random access memory manufacturing method according to another aspect of the present invention comprising: forming a transistor having a gate electrode formed above a surface of a semiconductor substrate, and a first impurity diffusion region and second impurity diffusion region which sandwich a channel region below the gate electrode; forming a first conductive plug and a second conductive plug on the first impurity diffusion region and the second impurity diffusion region, respectively; forming a stacked structure including a plurality of stacked layers on the first plug and the second plug; partially removing the stacked structure from an upper surface to a lower surface, forming, on the first plug, a recording element configured to hold information in accordance with an internal magnetization state, and forming an electrical conductor on the second plug, an area of a shape of the electrical conductor, which is projected onto the surface of the substrate, being larger than that of a shape of the recording element, which is projected onto the surface of the substrate; and forming a first signal line and a second signal line on the recording element and the electrical conductor, respectively.

BRIEF DESCRIPTION OF THE SEVERAL VIEWS OF THE DRAWING

FIG. 1 is a circuit diagram of the major parts of a magnetic memory device according to an embodiment of the present invention;

FIG. 6 is a sectional view of the magnetoresistive random access memory shown in FIG. 4;

FIG. 7 is a sectional view of the magnetoresistive random access memory shown in FIG. 4;

FIG. 8 is a plan view of a magnetoresistive random access memory according to another embodiment;

FIG. 16 is a sectional view of the major components of a magnetoresistive effect element according to another embodiment;

FIGS. 20A and 20B are sectional views showing a predetermined state in a manufacturing step of the structure shown in FIGS. 19A and 19B.

DETAILED DESCRIPTION OF THE INVENTION

The present inventors obtained the following findings in the course of developing the present invention.

Figure 19A:
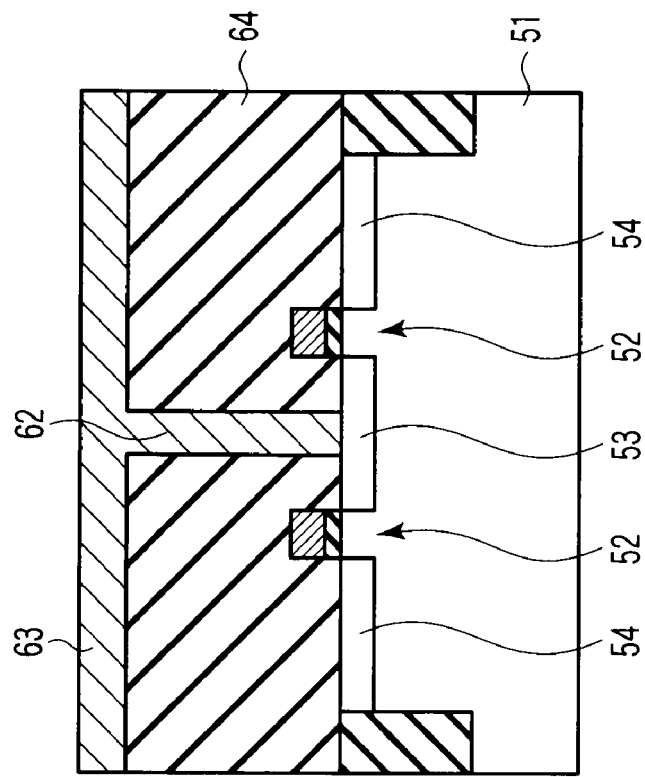
FIGS. 19A and 19B are sectional views showing a possible structure of a magnetoresistive random access memory.
Figure 19B:
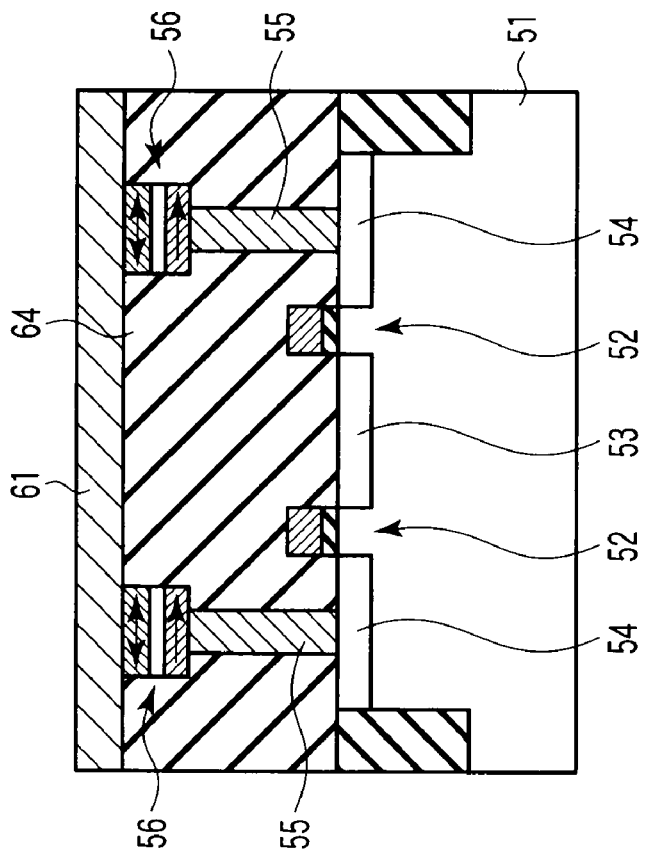

First, a structure shown in FIGS. 19A and 19B is possible as a structure for implementing a spin transfer torque writing type magnetoresistive random access memory. FIGS. 19A and 19B illustrate sectional structures taken along two parallel sections. As shown in FIGS. 19A and 19B, selection transistors 52 are formed on a substrate 51. The two selection transistors 52 share a source/drain region 53 that extends to the section shown in FIG. 19B. Source/drain regions 54 of the selection transistors 52 are connected to the lower surfaces of magnetoresistive effect elements (MR elements) 56 via plugs 55. The upper surfaces of the MR elements 56 are connected to a signal line 61. In the section shown in FIG. 19B, a contact plug 62 is formed on the source/drain region 53. The upper surface of the contact plug 62 is connected to a signal line 63. An interlayer dielectric film 64 is buried between the substrate 51 and signal lines 61 and 63.

In the structure shown in FIGS. 19A and 19B, the signal line 61 connected to one terminal of a memory cell and the signal line 63 connected to the other terminal can be formed in the same interconnection layer. This makes it possible to efficiently use the space above the substrate, and increase the degree of integration.

The following steps can be used to manufacture the structure shown in FIGS. 19A and 19B. First, as shown in FIGS. 20A and 20B, selection transistors 52 are formed on a substrate 51. Then, an insulating film 64a as a part of an interlayer dielectric film 64 is formed on the entire surface of the substrate 51. Contact plugs 55 are formed in the insulating film 64a. MR elements 56 are formed on the insulating film 64a and contact plugs 55. An insulating film 64b as a part of the interlayer dielectric film 64 is buried between the MR elements 56.

Figure 21B:
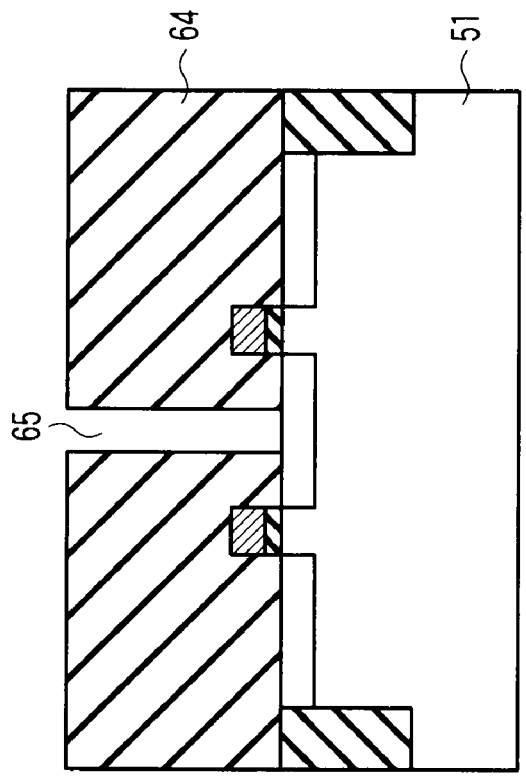
FIGS. 21A and 21B are sectional views showing a state following FIGS. 20A and 20B.
Figure 21A:
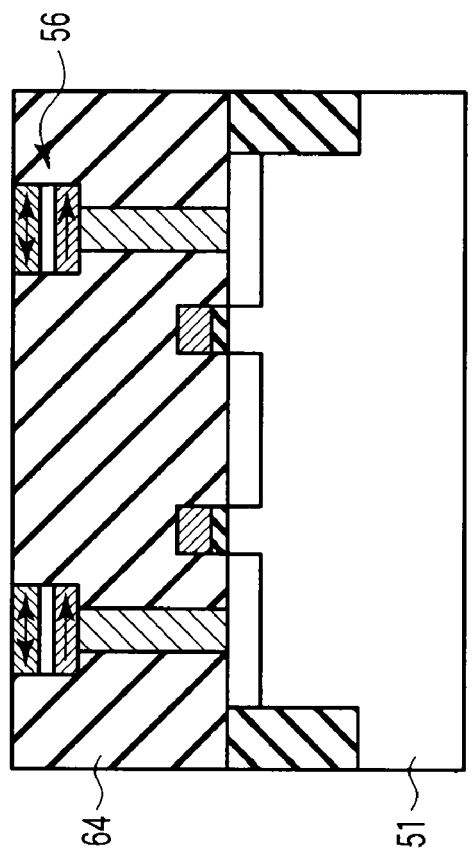

Subsequently, as shown in FIGS. 21A and 21B, a contact hole 65 for a contact plug 62 is formed. That is, contact holes for the contact plugs 55 and the contact hole 65 cannot be formed in the same step. The pitch between the contact hole 65 and the contact plugs 55 already formed is very small because the integration degree of the magnetoresistive random access memory is increased. This makes it very difficult to form the contact hole 65 in a desired position without affecting the already formed elements. It is particularly difficult to avoid the effect on the MR elements 56. Also, the efficiency decreases because the contact holes for the contact plugs 55 and the contact hole 65 positioned in the same layer are formed in difference steps.

Embodiments of the present invention configured on the basis of the above findings will be explained below with reference to the accompanying drawing. Note that in the following explanation, the same reference numerals denote constituent elements having almost the same functions and arrangements, and a repetitive explanation will be made only when necessary. However, it should be noted that each figure is an exemplary view, so the relationships between the thicknesses and planar dimensions, the ratios of the thicknesses of individual layers, and the like are different from the actual ones. Therefore, practical thicknesses and dimensions should be judged by referring to the following explanation. Note also that figures naturally include portions different in dimensional relationship and dimensional ratio.

Furthermore, each embodiment to be described below exemplifies an apparatus and method for embodying the technical idea of the present invention, so the technical idea of the present invention does not limit the materials, shapes, structures, layouts of constituent parts, and the like to those described below. The technical idea of the present invention can be variously changed within the scope of the appended claims.

A magnetoresistive random access memory according to an embodiment of the present invention will be explained below with reference to FIGS. 1 to 18. FIG. 1 is a circuit diagram of the major components of a magnetic memory device according to the embodiment of the present invention. As shown in FIG. 1, a memory cell array MCA comprises memory cells MC arranged in a matrix. Each memory cell MC includes a magnetoresistive effect element (to be referred to as an MR element hereinafter) MR and selection transistor ST connected in series. The MR element MR can take two steady states by a spin transfer torque writing method. Details will be explained later. The selection transistor ST is, e.g., a MOSFET (Metal Oxide Semiconductor Field Effect Transistor).

FIG. 1 shows first to fourth columns COL1 to COL4 as a part of the magnetoresistive random access memory. Elements belonging to the columns COL1 to COL4 have suffixes that are the same numbers as the numbers of the corresponding columns. Since, however, the columns COL1 to COL4 have the same arrangement, these elements will be described without the suffixes in the following explanation except when it is necessary to individually specify the elements.

In each column COL, the memory cells MC are connected in parallel. More specifically, the end portion on the MR element side of each memory cell MC is connected to the end portion on the MR element side of another memory cell MC, and the end portion on the selection transistor side of the memory cell MC is connected to the end portion on the selection transistor side of still another memory cell MC. In the column COL, the MR element MR and a connection node of two MR elements MR are electrically connected to a first bit line BLu. Also, in the column COL, a connection node of two selection transistors ST is electrically connected to a second bit line BLd.

First bit lines BLu1 to BLu4 are each connected to one terminal of a corresponding one of switching elements Qu1 to Qu4 each comprising, e.g., a MOSFET. The other terminal of each of the switching elements Qu1 to Qu4 is connected to a first common line CL1.

Second bit lines BLd1 to BLd4 are each connected to one terminal of a corresponding one of switching elements Qd1 to Qd4 each comprising, e.g., a MOSFET. The other terminal of each of the switching elements Qd1 to Qd4 is connected to a second common line CL2.

The first common line CL1 is connected to a write current source/sink-read current sink circuit SSC1. The second common line CL2 is connected to a write current source/sink circuit SSC2 and read circuit RC. The write current source/ sink-read current sink circuit SSC1 has the functions of a write current source, write current sink, and read current sink. The write current source/sink circuit SSC2 has the functions of a write current source and write current sink.

In accordance with write data, one of the write current source/sink-read current sink circuit SSC1 and write current source/sink circuit SSC2 functions as a current sink, and the other functions as a current source, or vice versa. Consequently, a write current can be supplied to the memory cell MC in a direction corresponding to the logic of the write data. Also, the write current source/sink-read current sink circuit SSC1 functions as a read current sink, and a read current flows from the read circuit RC to this read current sink via the memory cell MC as an object of read. The read circuit RC discriminates data held by the memory cell MC as an object of read by using the read current.

The control terminals (gate electrodes) of the switching elements Qu1 to Qu4 and Qd1 to Qd4 are connected to a column decoder CD. The column decoder CD turns on a pair of switching elements Qu and Qd belonging to a column COL selected in accordance with an external address signal.

The gate electrodes of the selection transistors ST of the memory cells MC belonging to the same row are connected together to form one of word lines WL1 to WL4. The word lines WL1 to WL4 are connected to a row decoder RD. The row decoder RD turns on the selection transistors ST connected to one of the word lines WL1 to WL4 selected in accordance with an external address signal.

Figure 2:
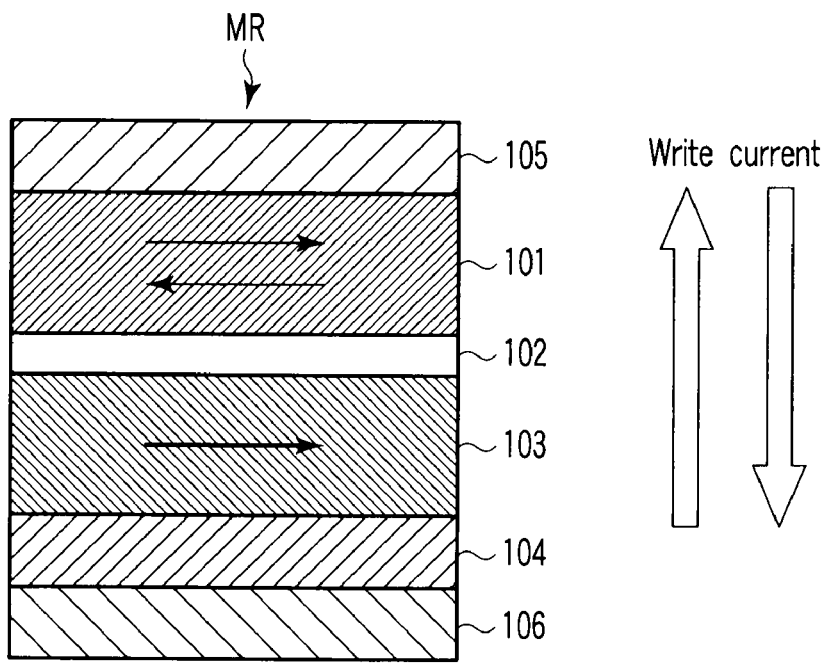
FIG. 2 is a sectional view of the main components of a magnetoresistive effect element according to the embodiment.

As shown in FIG. 2, for example, the MR element MR includes sequentially stacked layers, i.e., at least a fixed layer (magnetization fixed layer) 103 made of a ferromagnetic material, an interlayer 102 made of a nonmagnetic material, and a free layer (magnetization free layer, magnetization variable layer, or recording layer) 101 made of a ferromagnetic material.

Note that the free layer 101 and (or) the fixed layer 103 may also have a stacked structure including sublayers. The magnetization direction in the fixed layer 103 is fixed. The magnetization direction in the fixed layer 103 can be fixed by forming an antiferromagnetic layer 104 on the surface of the fixed layer 103 away from the surface opposing the nonmagnetic layer.

On the other hand, no such magnetization fixing mechanism is formed for the magnetization direction in the free layer 101. Therefore, the magnetization direction in the free layer 101 is variable. The easy magnetization axis in the free layer 101 and the magnetization direction in the fixed layer 103 are parallel to the opposing surfaces of the free layer 101, interlayer 102, and fixed layer 103. That is, the MR element MR has so-called, longitudinal magnetization.

A nonmagnetic metal, nonmagnetic semiconductor, insulating film, or the like can be used as the interlayer 102.

Furthermore, an electrode 105 may also be formed on the surface of the free layer 101 away from the surface opposing the nonmagnetic layer 102, and an electrode 106 may also be formed on the surface of the antiferromagnetic layer 104 away from the surface opposing the fixed layer 103.

An electron flow is supplied from the fixed layer 103 to the free layer 101 in order to reverse magnetization in the free layer 101, which is antiparallel to the magnetization direction in the fixed layer 103, thereby making magnetization in the free layer 101 parallel to the magnetization direction in the fixed layer 103. On the other hand, an electron flow is supplied from the free layer 101 to the fixed layer 103 in order to reverse magnetization in the free layer 101, which is parallel to the magnetization direction in the fixed layer 103, thereby making magnetization in the free layer 101 antiparallel to the magnetization direction in the fixed layer 103.

As the ferromagnetic material of the free layer 101 and fixed layer 103, it is possible to use, e.g., Co, Fe, Ni, or an alloy containing any of these materials. As the material of the antiferromagnetic layer 104, it is possible to use, e.g., Fe—Mn, Pt—Mn, Pt—Cr—Mn, Ni—Mn, Pd—Mn, NiO, $Fe_2O_3$, or a magnetic semiconductor.

When using a nonmagnetic metal as the interlayer 102, it is possible to use one of Au, Cu, Cr, Zn, Ga, Nb, Mo, Ru, Pd, Ag, Hf, Ta, W, Pt, and Bi, or an alloy containing one or more types of these metals. When allowing the interlayer 102 to function as a tunnel barrier layer, $Al_2O_3$, $SiO_2$, MgO, AlN, or the like can be used.

Note that the MR element MR may also have a structure obtained by turning the structure shown in FIG. 2 upside down.

Figure 3:
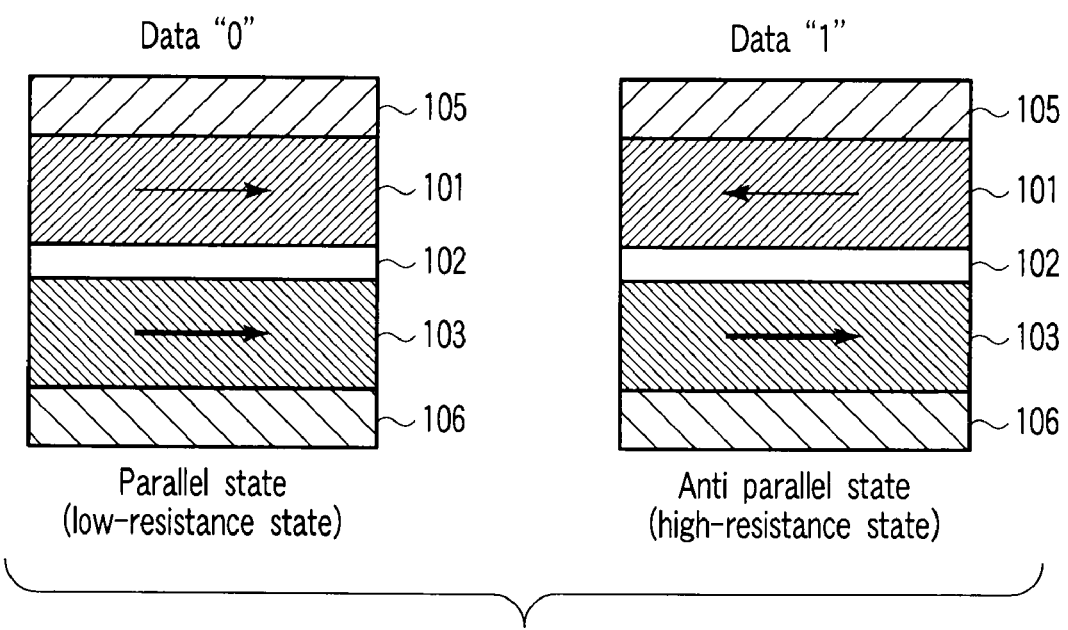
FIG. 3 is a view showing the two states of the magnetoresistive effect element.

The two resistance states of the MR element MR shown in FIG. 2 are made to correspond to the logic of data held by the MR element MR as shown in, e.g., FIG. 3. That is, a state (low-resistance state) in which the magnetization directions in the fixed layer 103 and free layer 101 are parallel is regarded as a data "0" holding state, and a state (high-resistance state) in which the magnetization directions in the fixed layer 103 and free layer 101 are antiparallel is regarded as a data "1" holding state. Note that the antiferromagnetic layer 104 is not illustrated in FIG. 3.

Figure 4:
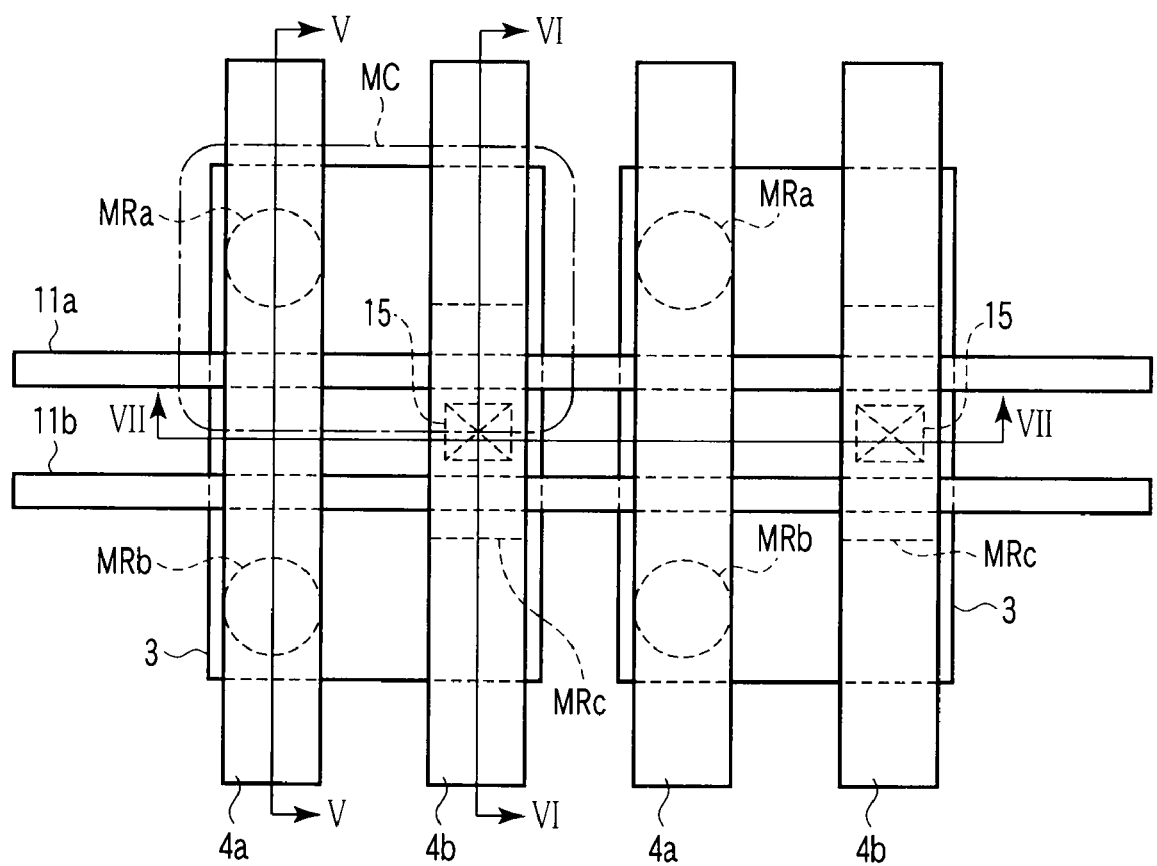
FIG. 4 is a plan view of the main parts of a magnetoresistive random access memory according to the embodiment.
Figure 5:
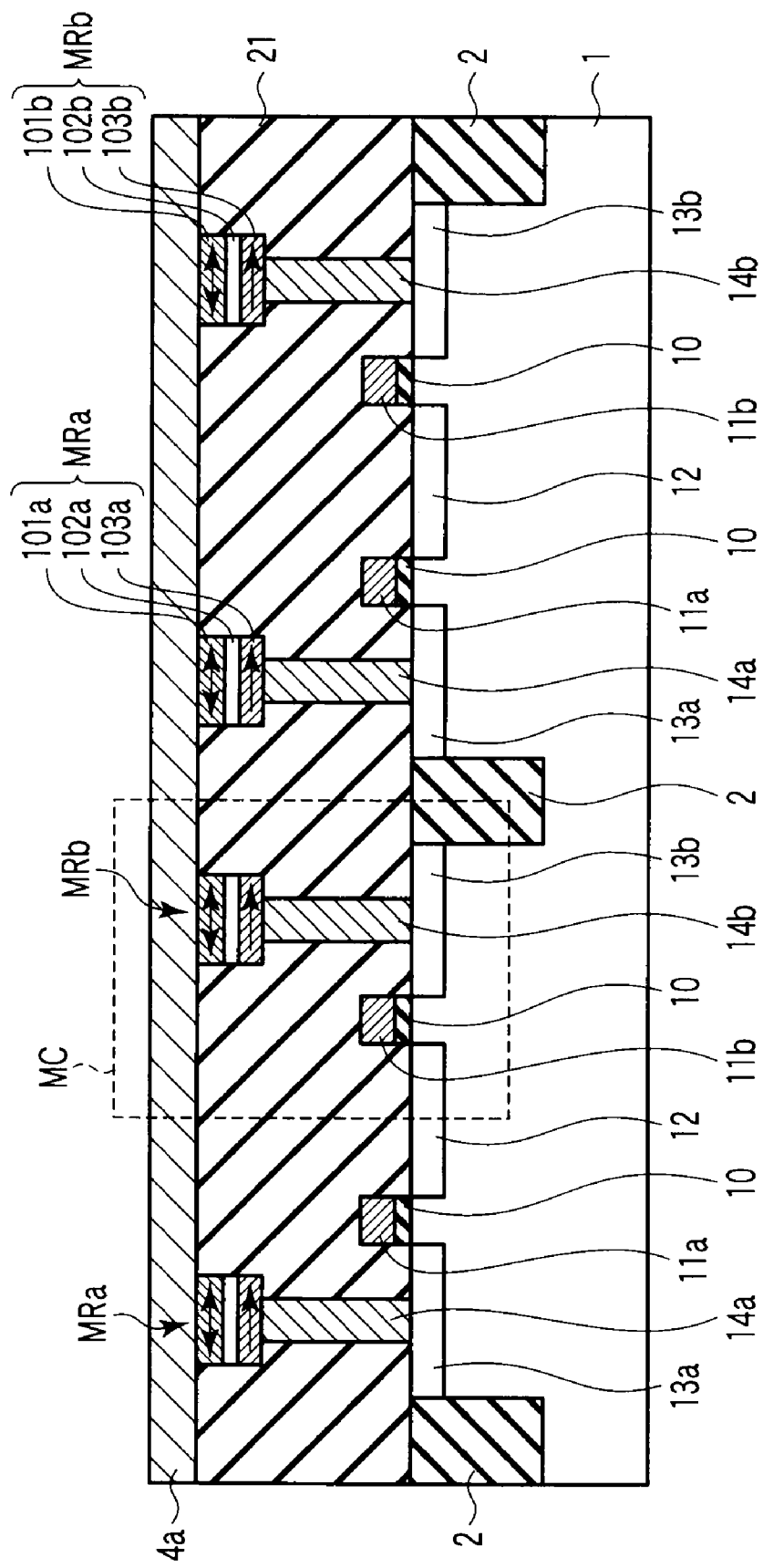
FIG. 5 is a sectional view of the magnetoresistive random access memory shown in FIG. 4.

The structure of the magnetoresistive random access memory according to the embodiment will be explained below with reference to FIGS. 4 to 9. FIG. 4 is a plan view of the main parts of the magnetoresistive random access memory according to the embodiment. FIG. 4 shows four memory cell portions adjacent to each other shown in FIG. 1. FIG. 5 is a sectional view showing a structure taken along a line V-V in FIG. 4. FIG. 6 is a sectional view showing a structure taken along a line VI-VI in FIG. 4. FIG. 7 is a sectional view showing a structure taken along a line VII-VII in FIG. 4.

As shown in FIGS. 4 to 7, an insulating film 2 for element isolation is formed in the surface of a substrate 1 made of, e.g., silicon. The insulating film 2 has an appropriate width, surrounds element regions (active regions) 3, and has an STI (Shallow Trench Isolation) structure or the like. In the sectional structures shown in FIGS. 6 to 8, the insulating film 2 is separated into portions spaced apart from each other.

Signal lines (interconnections) 4a and 4b made of a conductive material are formed above the substrate 1. The signal lines 4a and 4b run in the column direction (the vertical direction in FIG. 4), and are spaced apart from each other in the row direction (the horizontal direction in FIG. 4). The signal lines 4a and 4b respectively have the functions of the first and second bit lines BLu and BLd shown in FIG. 2. The signal lines 4a and 4b are positioned at the same height. That is, the signal lines 4a and 4b are formed by the first interconnection layer (M1 layer). Note that in the following description, when it is unnecessary to distinguish between reference numerals having different alphabets suffixed to the same number, these alphabets as the suffixes will be omitted, and the reference numerals having different suffixes will be comprehensively expressed. For example, signal lines 4 mean the signal lines 4a and 4b.

Gate insulating films 10 and gate electrodes 11a and 11b are stacked on the surface of the substrate 1 in the element region 3. The gate electrodes 11a and 11b extend in the row direction (the horizontal direction in FIG. 4), and are spaced apart from each other in the column direction (the vertical direction in FIG. 4). The gate electrodes 11a and 11b have the functions of two word lines WL (e.g., the word lines WL1 and WL2) belonging to two rows in each of which the selection transistors are connected, of all the rows shown in FIG. 1.

In the surface region of the substrate 1, an impurity diffusion region 12 is formed as a source/drain region between the gate electrodes 11a and 11b. In the surface region of the substrate 1, an impurity diffusion region 13a is formed as a source/drain region on the side of the gate electrode 11a away from the impurity diffusion region 12, and an impurity diffusion region 13b is formed as a source/drain region on the side of the gate electrode 11b away from the impurity diffusion region 12. The impurity diffusion region 12 is spaced apart from the impurity diffusion regions 13a and 13b by portions below the gate electrodes 11a and 11b, respectively. The gate electrode 11a and impurity diffusion regions 12 and 13a form a selection transistor ST, and the gate electrode 11b and impurity diffusion regions 12 and 13b form a selection transistor ST.

The impurity diffusion region 12 extends from a region below the signal line 4a to a region below the signal line 4b. The impurity diffusion regions 13 can extend from the region below the signal line 4a to the region below the signal line 4b, or can be spaced apart between the portions below the signal lines 4a and 4b.

Contact plugs 14a and 14b in contact with the impurity diffusion regions 13a and 13b are formed between the impurity diffusion region 13a and signal line 4a and between the impurity diffusion region 13b and signal line 4a, respectively. The MR elements MR shown in FIG. 2 are formed on the contact plugs 14a and 14b. The MR elements MR on the contact plugs 14a and 14b are distinguished from each other as MR elements MRa and MRb, respectively.

The MR elements MRa and MRb have the function of a data recording carrier of the memory cell MC. In the section shown in FIG. 5, the MR elements MRa and MRb respectively have widths equivalent to those of the impurity diffusion regions 13a and 13b. The widths of the MR elements MRa and MRb in the horizontal direction of FIG. 4 are respectively equivalent to those of the signal lines 4a and 4b. The upper surfaces of the MR elements MRa and MRb are connected to the lower surface of the signal line 4a. Note that in FIG. 5, only the free layers 101 (101a and 101b), interlayers 102 (102a and 102b), and fixed layers 103 (103a and 103b) of the MR elements MR (MRa and MRb) are illustrated, and the electrodes 105 and 106 and the like are not illustrated, for the sake of simplicity. Referring to FIG. 5, the magnetization directions in the MR element MRb are antiparallel. However, the magnetization directions can be either parallel or antiparallel as long as a desired resistance value can be given as an MR element for a reference cell RC.

A contact plug 15 in contact with the impurity diffusion region 12 is formed between the impurity diffusion region 12 and signal line 4b. An MR element MR (MR element MRc) is formed on the contact plug 15. The MR element MRc is formed in the same step as that of the MR elements MRa and MRb. Accordingly, a free layer 101c, interlayer 102c, and fixed layer 103c forming the MR element MRc have the same characteristics, including the thicknesses, materials, and the like and excluding the area, as those of the free layers 101a and 101b, interlayers 102a and 102b, and fixed layers 103a and 103b. As will be described in detail later, however, the shape (the shape shown in FIG. 4) of the MR element MRc, which is projected onto the substrate 1, differs from that of the MR elements MRa and MRb. The electrodes 105 and 106 and the like are not illustrated in FIG. 6 either.

While the MR elements MRa and MRb have the function of a data storage carrier as described above, the MR element MRc has the function of a simple electrical conductor. To give the MR element MRc this function, the area of the shape (to be referred to as a planar shape hereinafter) of the MR element MRc, which is projected onto the substrate 1, is larger than that of the planar shape of the MR elements MRa and MRb. Note that the MR element MRc comprises a plurality of layers (e.g., the free layer 101c, interlayer 102c, and fixed layer 103c) as described above, and these layers normally have the same planar shape. Therefore, an expression "the planar shape of the MR element MRc" inclusively indicates the planar shape of the layers forming the MR element MRc. This similarly applies to the MR elements MRa and MRb.

The planar shape of the MR element MRc is determined by taking the following factors into consideration. First, the resistance value of the MR element MRc must be small to such an extent that the voltage drop of the MR element MRc has almost no influence on the operation of the magnetoresistive random access memory. "Has almost no influence" herein mentioned means that even if there is an influence on the operation, the influence falls within an allowable range when the operation margin and the like of the magnetoresistive random access memory are taken into account. Second, it is necessary to prevent the reversal of magnetization in the free layer 101c of the MR element MRc. To meet these two requirements, the MR element MRc, more specifically, the layers (at least the free layer 101c, interlayer 102c, and fixed layer 103c) forming the MR element MRc have a planar area larger than that of the free layers 101a and 101b, interlayers 102a and 102b, and fixed layers 103a and 103b of the MR elements MRa and MRb.

As a practical embodiment, the MR element MRc extends over the contact plug 15 and the gate electrodes 11a and 11b on the two sides of the contact plug 15. That is, the length of the MR element MRc in the horizontal direction of FIG. 6 (the length of the MR element MRc in the vertical direction of FIG. 4) is larger than the length of the MR elements MRa and MRb in the horizontal direction of FIG. 5 (the length of the MR elements MRa and MRb in the vertical direction of FIG. 4). The length of the MR elements MRa to MRc in the horizontal direction of FIG. 4 is almost equal to that of the signal lines 4a and 4b in the horizontal direction of FIG. 4. This length is adopted to facilitate control when processing the MR element MRa, and is not essential. The length of the MR element MRc in the horizontal direction of FIG. 4 may also be larger than that of the signal line 4a in the horizontal direction, provided that the processing technique is not limited. This makes it possible to further increase the size of the planar shape of the MR element MRc.

As shown in FIG. 4, when the aspect ratio of the MR element MRc is higher than that of the MR elements MRa and MRb, the reversal of magnetization in the free layer 101c of the MR element MRc can be prevented more reliably.

Figure 9:
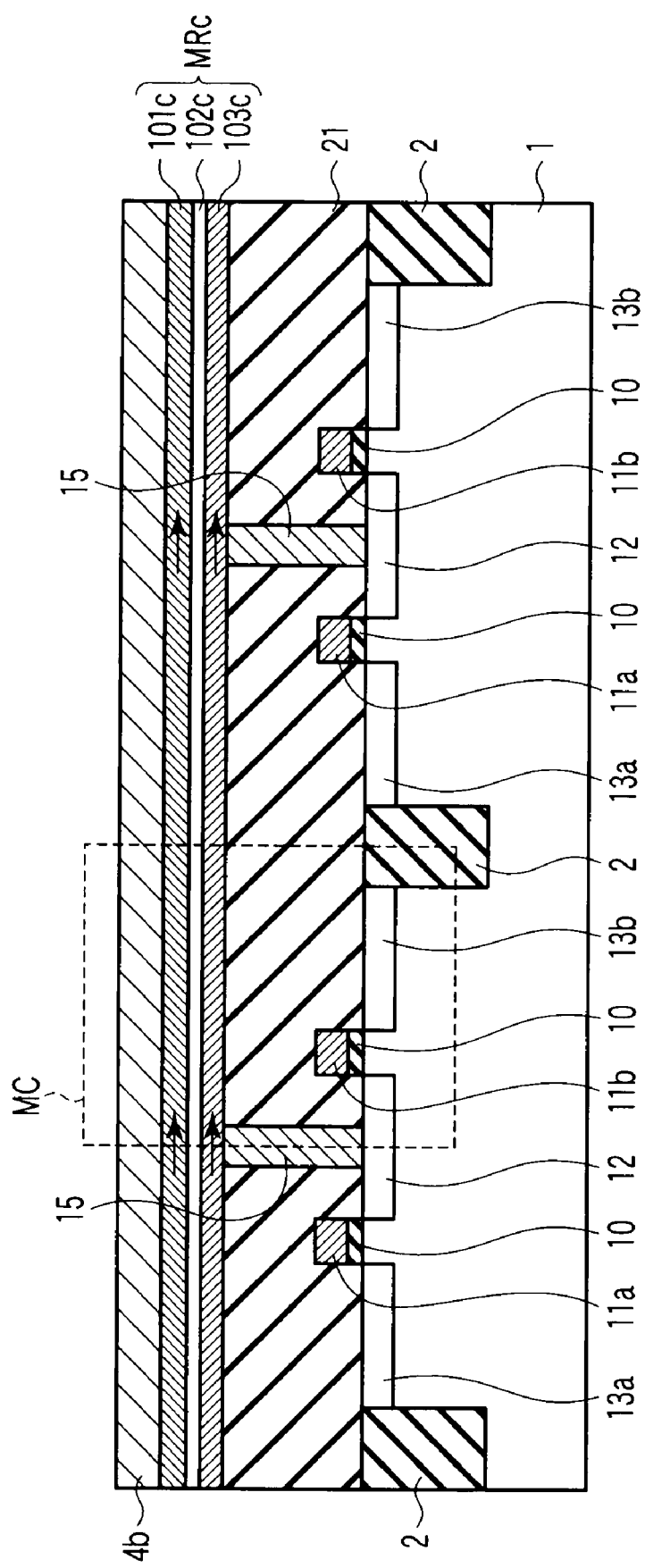
FIG. 9 is a sectional view of the magnetoresistive random access memory shown in FIG. 8.

The planar shape of the MR element MRc can be formed as follows in order to further decrease the resistance value described above, and prevent magnetization reversal in the free layer 101c more reliably. That is, as shown in FIGS. 8 and 9, the planar shape of the MR element MRc is formed into a linear shape extending along the signal line 4b. FIG. 8 is a plan view of the major parts of a magnetoresistive random access memory according to another embodiment. FIG. 9 is a sectional view showing a structure taken along a line IX-IX in FIG. 8. Structures taken along lines V-V and VII-VII in FIG. 8 are the same as those shown in FIGS. 5 and 7, respectively.

The magnetization directions in the free layer 101c and fixed layer 103c of the MR element MRc are fixed parallel. This is so because the resistance value when the magnetization directions in two ferromagnetic layers of an MR element are parallel can be made smaller than that when they are antiparallel.

An interlayer dielectric film 21 made of, e.g., a silicon oxide film is buried in a region between the substrate 1 and signal lines 4a and 4b.

The memory cell MC comprises the gate insulating film 10, gate electrode 11b (11a), impurity diffusion regions 12 and 13b (13a), contact plug 14b (14a), and MR element MRb (MRa).

Figure 10:
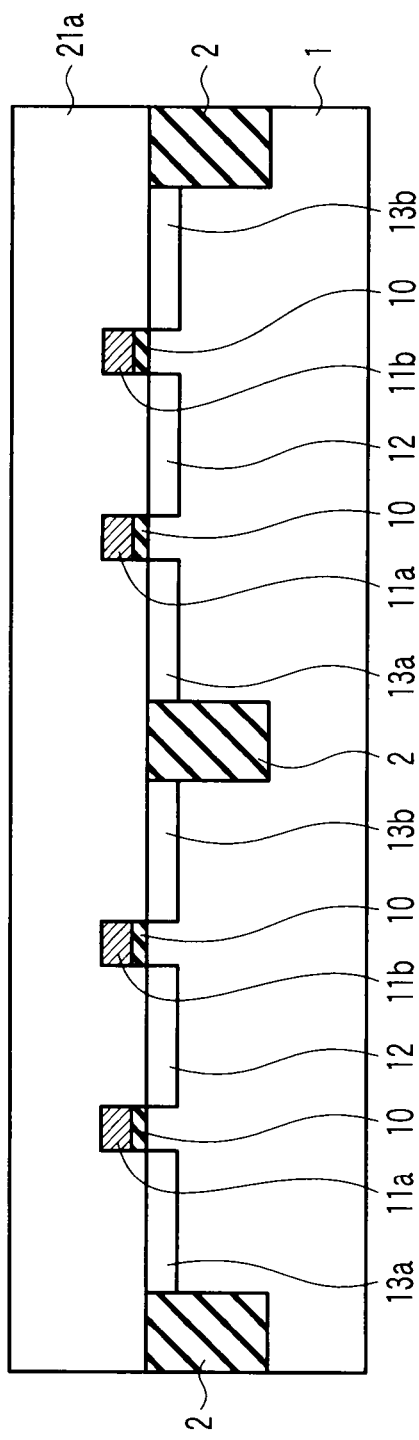
FIG. 10 is a sectional view showing a predetermined state in a manufacturing step of the semiconductor memory device according to the embodiment.
Figure 11:
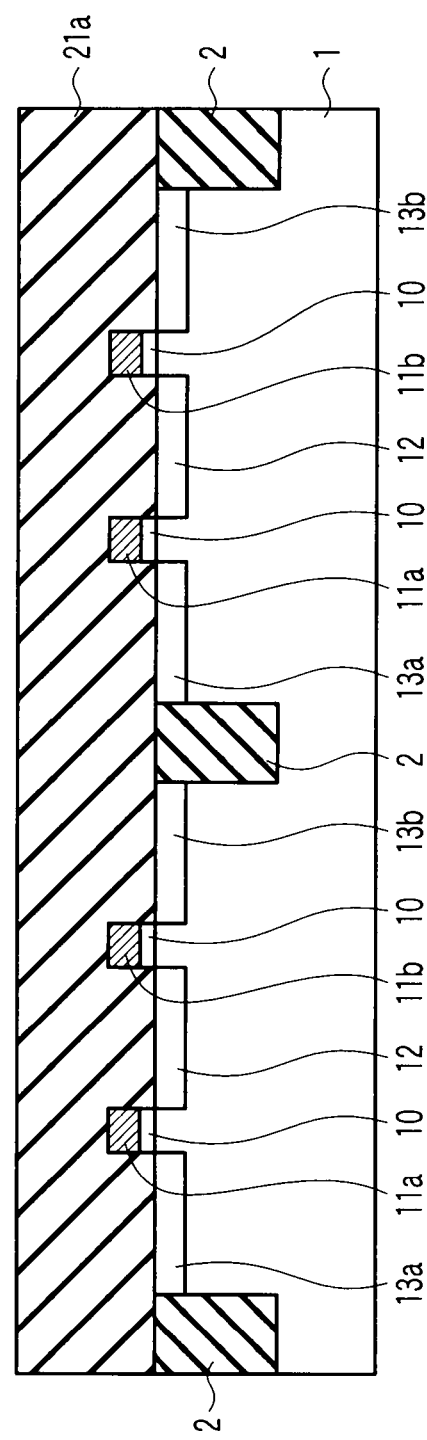
FIG. 11 is a sectional view showing a predetermined state in a manufacturing step of the semiconductor memory device according to the embodiment.
Figure 12:
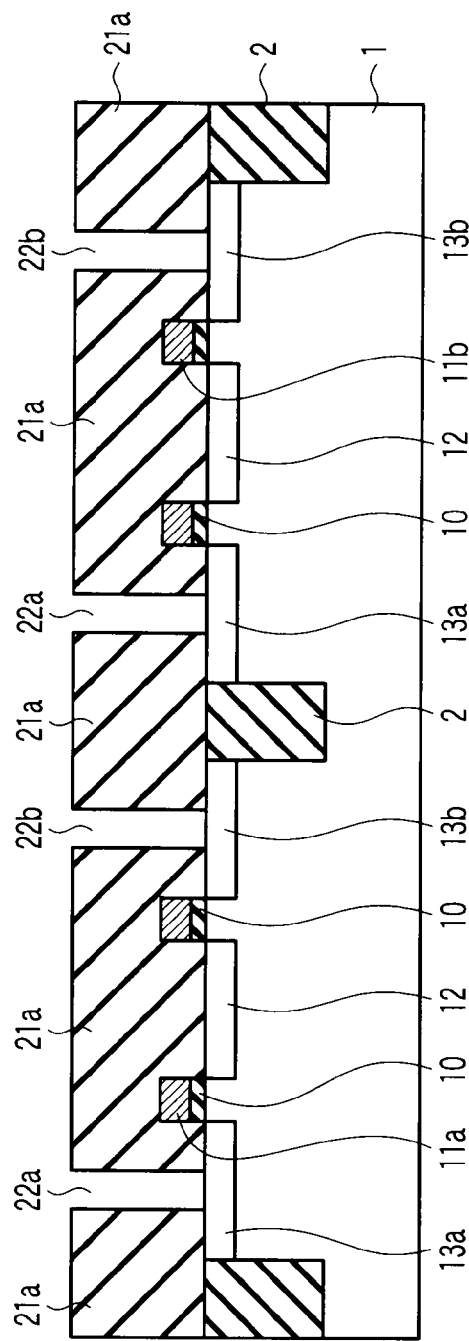
FIG. 12 is a sectional view showing a state following FIG. 10.
Figure 13:
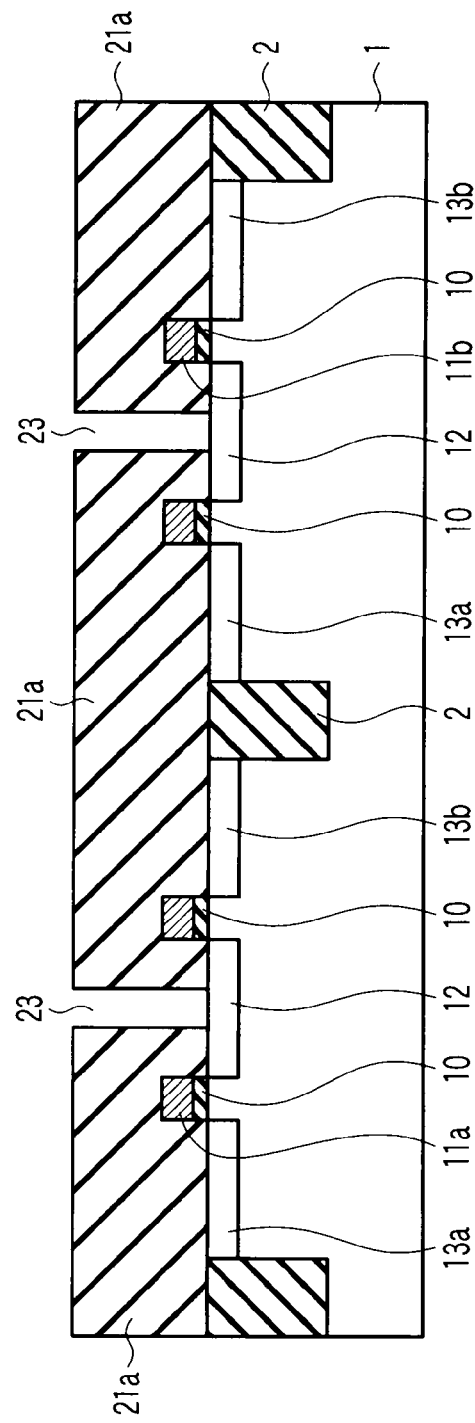
FIG. 13 is a sectional view showing a state following FIG. 11.
Figure 14:
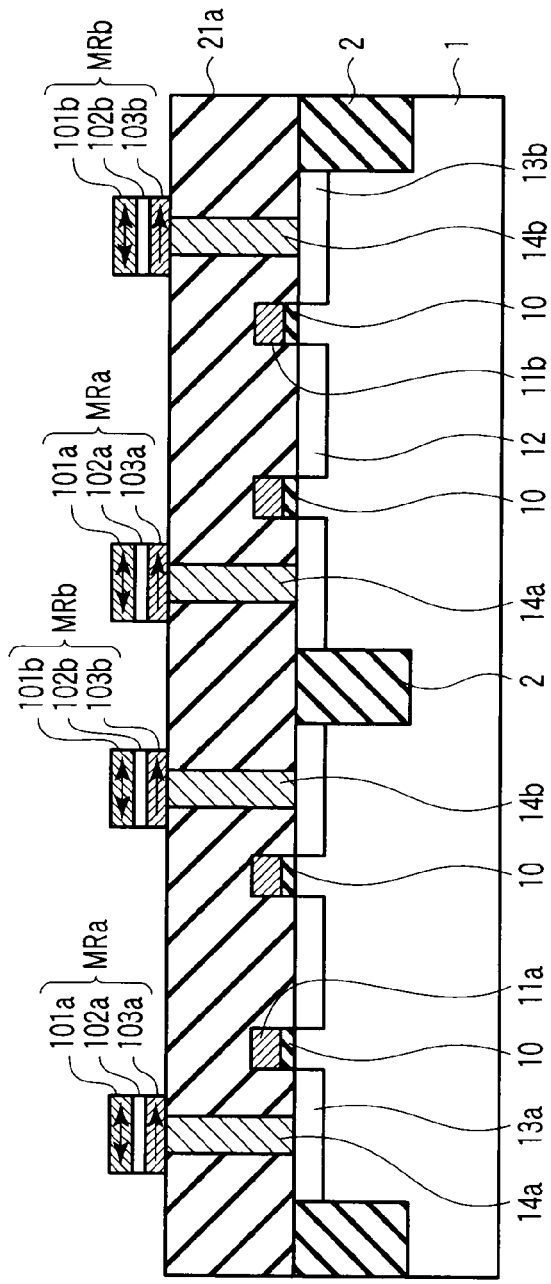
FIG. 14 is a sectional view showing a state following FIG. 12.
Figure 15:
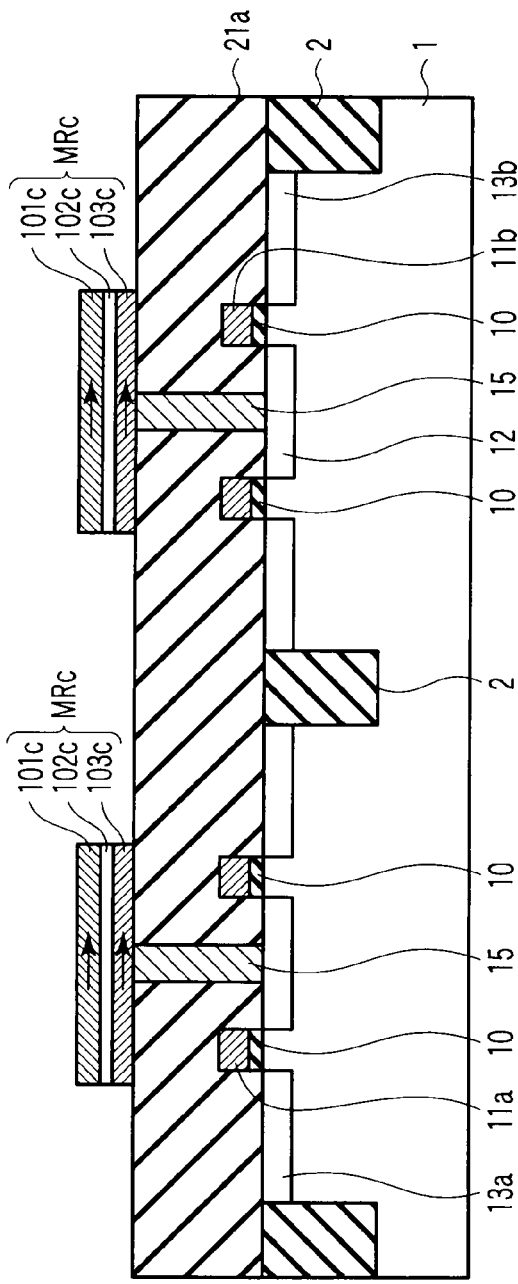
FIG. 15 is a sectional view showing a state following FIG. 13.

Manufacturing steps of the magnetoresistive random access memory according to the embodiment of the present invention will be explained below with reference to FIGS. 10 to 15. FIGS. 10, 12, and 14 illustrate steps in a method of manufacturing the magnetoresistive random access memory shown in FIG. 5 in order. FIGS. 11, 13, and 15 illustrate steps in a method of manufacturing the magnetoresistive random access memory shown in FIG. 6.

As shown in FIGS. 10 and 11, a mask material having openings in prospective formation regions of an insulating film 2 is formed on the surface of a substrate 1 by a film formation technique such as CVD (Chemical Vapor Deposition), lithography, and anisotropic etching such as RIE (Reactive Ion Etching). Then, the mask material is used to form trenches for an insulating film 2 by anisotropic etching such as RIE. An insulating film 2 is formed in the trenches by a film formation technique such as CVD (Chemical Vapor Deposition). After that, the mask material is removed.

Subsequently, ion implantation for adjusting the threshold voltage of a selection transistor is performed in prospective channel formation regions of selection transistors. An insulating film and conductive film for forming a gate insulating film 10 and gate electrodes 11a and 11b are formed by thermal oxidation and a film formation technique such as CVD. The insulating film and conductive film are then patterned by lithography, anisotropic etching, and the like, thereby forming a gate insulating film 10 and gate electrodes 11a and 11b. After that, impurity diffusion regions 12, 13a, and 13b are formed by ion implantation. An insulating film 21a as a part of an interlayer dielectric film 21 is formed by, e.g., CVD.

As shown in FIGS. 12 and 13, a mask material (not shown) having openings above prospective formation regions of contact plugs 14a, 14b, and 15 is formed on the insulating film 21a by etching, e.g., CVD, lithography, and RIE. The mask material is used as a mask to partially remove the insulating film 21a by anisotropic etching, thereby forming contact holes 22a and 22b on the impurity diffusion regions 13a and 13b, respectively, and a contact hole 23 on the impurity diffusion region 12. In this manner, the contact holes 22a and 22b connected to one terminal of a selection transistor ST and a contact hole 23 connected to the other terminal are formed in the same step. After that, the mask material is removed.

As shown in FIGS. 14 and 15, contact plugs 14a, 14b, and 15 are respectively formed in the contact holes 22a, 22b, and 23 by a film formation technique such as CVD. Films for forming fixed layers 103a, 103b, and 103c, interlayers 102a, 102b, and 102c, and free layers 101a, 101b, and 101c are formed by a film formation technique such as CVD on the entire surface of the structure obtained by the steps performed so far. A mask material (not shown) is formed on the entire surface of the structure obtained by the steps performed so far.

A pattern remaining on prospective formation regions of MR elements MRa, MRb, and MRc is formed in the mask material by lithography. MR elements MRa, MRb, and MRc are then formed by patterning the material films by anisotropic etching using the mask material. After that, the mask material is removed.

As shown in FIGS. 5 and 6, an interlayer dielectric film 21 is formed by forming another insulating film. Subsequently, signal lines 4a and 4b are formed by lithography, etching, a film formation technique, and the like.

Figure 17:
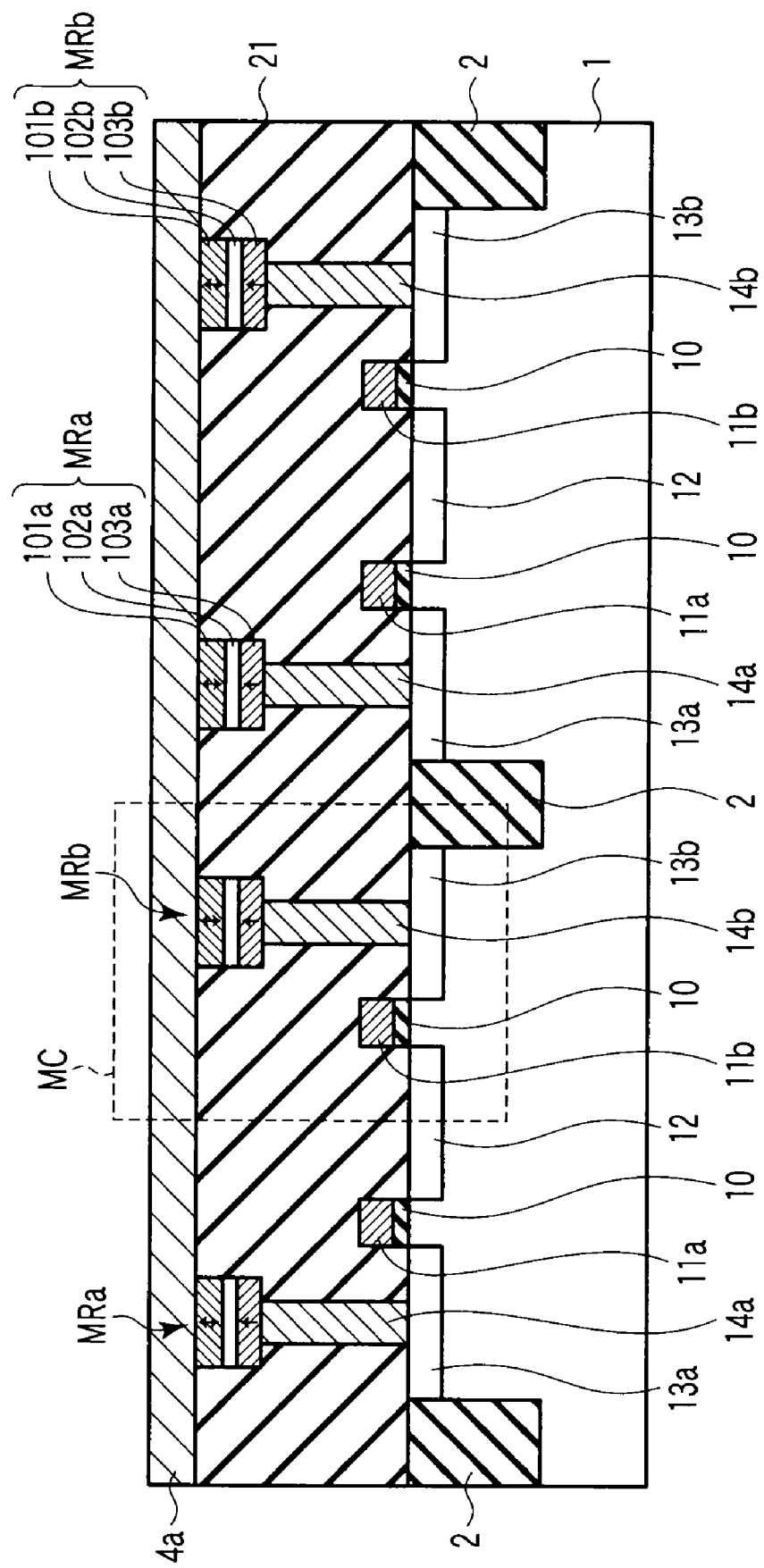
FIG. 17 is a sectional view of a magnetoresistive random access memory according to the other embodiment.
Figure 18:
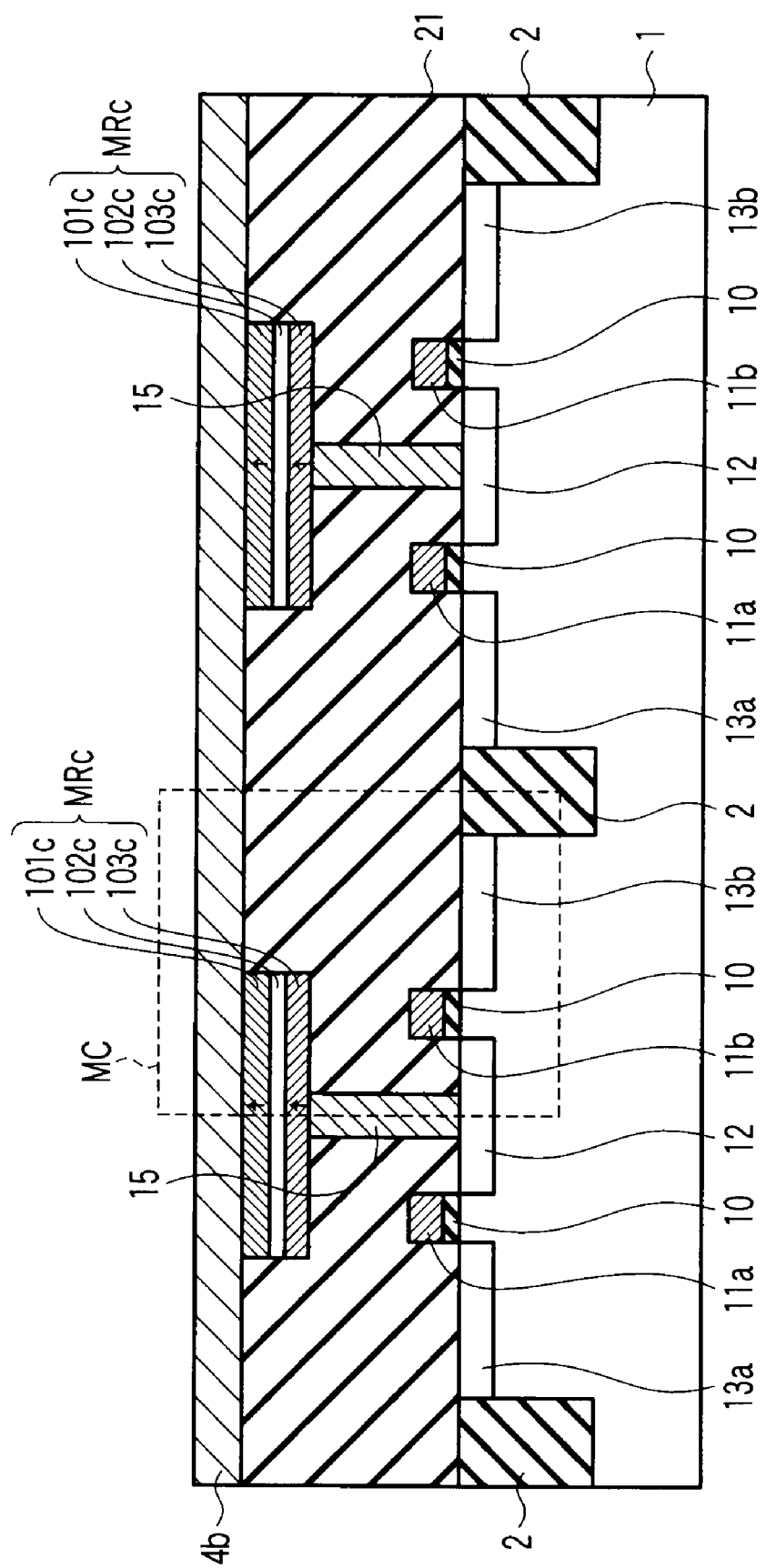
FIG. 18 is a sectional view of a magnetoresistive random access memory according to the other embodiment.

In the above explanation, the magnetization directions in the free layer 101 and fixed layer 103 are parallel to the opposing surfaces of the individual layers of the MR element MR. However, this embodiment is not limited to this form. As shown in FIGS. 16 to 18, the magnetization directions in the free layer 101 and fixed layer 103 may also be perpendicular to the layers of the MR element MR. That is, the MR element MR may also have so-called perpendicular magnetization.

FIG. 16 is a sectional view of the main components of a magnetoresistive effect element according to another embodiment. FIG. 17 is a sectional view of the magnetoresistive random access memory according to the other embodiment, and shows a structure taken along the same section as shown in FIG. 5. FIG. 18 is a sectional view of the magnetoresistive random access memory according to the other embodiment, and shows a structure taken along the same section as shown in FIG. 6. The present invention can achieve the same effects as described above in the structure shown in FIGS. 16 to 18 as well. The magnetization directions in the free layer 101 and fixed layer 103 of the arrangement shown in FIGS. 8 and 9 may also be changed to those in the structure shown in FIGS. 16 to 18.

In the magnetoresistive random access memories according to the embodiments of the present invention, the signal lines 4a and 4b having the functions of two types of bit lines are formed in the same interconnection layer. This makes it possible to efficiently use the space above a substrate, and implement a magnetoresistive random access memory having a high integration degree.

Also, in the magnetoresistive random access memories according to the embodiments, the source/drain region 12 of the selection transistor ST, which is not connected to the MR element MRa (or MRb) as a recording element, is connected to the signal line 4b via the plug 15 and the MR element MRc as an electrical conductor whose magnetization configuration does not change. Therefore, the plugs 14 and 15 can be formed in the same step, i.e., the plug 15 need not be formed after the MR element MRa (MRb) is formed. This makes it possible to achieve efficient manufacturing steps and avoid steps that may inflict damage to the MR element MRa (MRb), while increasing the integration degree.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   a semiconductor substrate;
   a transistor having a gate electrode formed above a surface of the substrate, and a first impurity diffusion region and second impurity diffusion region which sandwich a channel region below the gate electrode;

a first conductive plug formed on the first impurity diffusion region;

a recording element formed on the first plug, including a plurality of stacked layers, and configured to hold information in accordance with an internal magnetization state;

a first signal line formed on the recording element;

a second conductive plug formed on the second impurity diffusion region;

an electrical conductor formed on the second plug and including a plurality of layers identical to the plurality of layers forming the recording element, an area of a shape of the electrical conductor, which is projected onto the surface of the substrate, being larger than that of a shape of the recording element, which is projected onto the surface of the substrate; and a second signal line formed on the electrical conductor.

2. The memory according to claim 1, wherein the recording element includes a magnetization fixed layer made of a first magnetic material and having a fixed magnetization direction, a magnetization variable layer made of a second magnetic material and having a variable magnetization direction, and an interlayer formed between the magnetization fixed layer and the magnetization variable layer and made of a nonmagnetic material, and the electrical conductor includes a first layer made of the first magnetic material, a second layer made of the second magnetic material, and a third layer formed between the first layer and the second layer and made of the nonmagnetic material.

3. The memory according to claim 2, wherein the shape of the electrical conductor, which is projected onto the surface of the substrate, is the same as that of the second signal line, which is projected onto the surface of the substrate.

4. The memory according to claim 3, wherein a magnetization direction in the first layer is fixed, and a magnetization direction in the second layer is unchangeable.

5. The memory according to claim 1, wherein the first signal line and the second signal line are positioned at the same height.

6. The memory according to claim 1, wherein a width of the electrical conductor in a direction perpendicular to a direction in which the second signal line runs is equal to that of the second signal line.

7. The memory according to claim 1, wherein a width of the electrical conductor in a direction perpendicular to a direction in which the second signal line runs is larger than that of the second signal line.

8. The memory according to claim 1, wherein the electrical conductor extends on the second plug and over the gate electrode.

9. The memory according to claim 1, wherein an aspect ratio of a planar shape of the electrical conductor is higher than that of a planar shape of the recording element.

10. The memory according to claim 1, wherein the electrical conductor includes a first layer made of a first magnetic material, a second layer made of a second magnetic material, and a third layer formed between the first layer and the second layer and made of a nonmagnetic material, and magnetization directions in the first layer and the second layer are fixed parallel.

11. The memory according to claim 1, wherein the first impurity diffusion region extends from a region below the first signal line to a region below the second signal line.

12. The memory according to claim 1, wherein the first impurity diffusion region is separated by a region below the first signal line and a region below the second signal line.

* * * * *